United States Patent [19]

Butler et al.

[11] 4,156,152
[45] May 22, 1979

[54] CHARGE TRANSFER CIRCUIT WITH LEAKAGE CURRENT COMPENSATING MEANS

[75] Inventors: Walter J. Butler; Charles M. Puckette, both of Scotia, N.Y.

[73] Assignee: General Electric Company, Schenectady, N.Y.

[21] Appl. No.: 842,403

[22] Filed: Oct. 17, 1977

[51] Int. Cl.² ............... G11C 19/28; H03K 25/02; H03K 1/04
[52] U.S. Cl. ............... 307/221 C; 307/221 D; 307/304
[58] Field of Search ............... 307/221 C, 221 D, 304

[56] References Cited
U.S. PATENT DOCUMENTS

| | | | |
|---|---|---|---|
| 3,621,402 | 11/1971 | Gardner | 307/221 C |
| 3,819,954 | 6/1974 | Butler et al. | 307/221 D |
| 3,876,952 | 4/1975 | Weimer | 307/221 D |
| 4,047,051 | 9/1977 | Heller | 307/221 D |
| 4,047,053 | 9/1977 | Ley et al. | 307/221 D |
| 4,092,549 | 5/1978 | Prince | 307/221 D |

*Primary Examiner*—John S. Heyman
*Attorney, Agent, or Firm*—Geoffrey H. Krauss; Joseph T. Cohen; Marvin Snyder

[57] ABSTRACT

A charge transfer circuit of the type including first and second charge storage locations and a charge transfer transistor for transferring a plurality of discrete packets of charge from the first to the second charge storage location is disclosed. The charge transfer circuit includes circuitry for compensating for changes in a thermally induced leakage current such that the charge transfer transistor transfers a variable amount of charge from the first to the second charge storage location during each successive charge transfer operation such that the total amount of charge, i.e. the leakage charge plus the transferred charge packet, accumulated by the second charge storage location during each charge transfer operation, is a constant regardless of changes in the temperature or illumination of the transistor. In a second embodiment, changes in the magnitude of the thermally or optically induced leakage current are taken into account by adjusting the magnitude of an analog signal to which the total amount of charge stored in the second charge storage location is compared.

12 Claims, 6 Drawing Figures

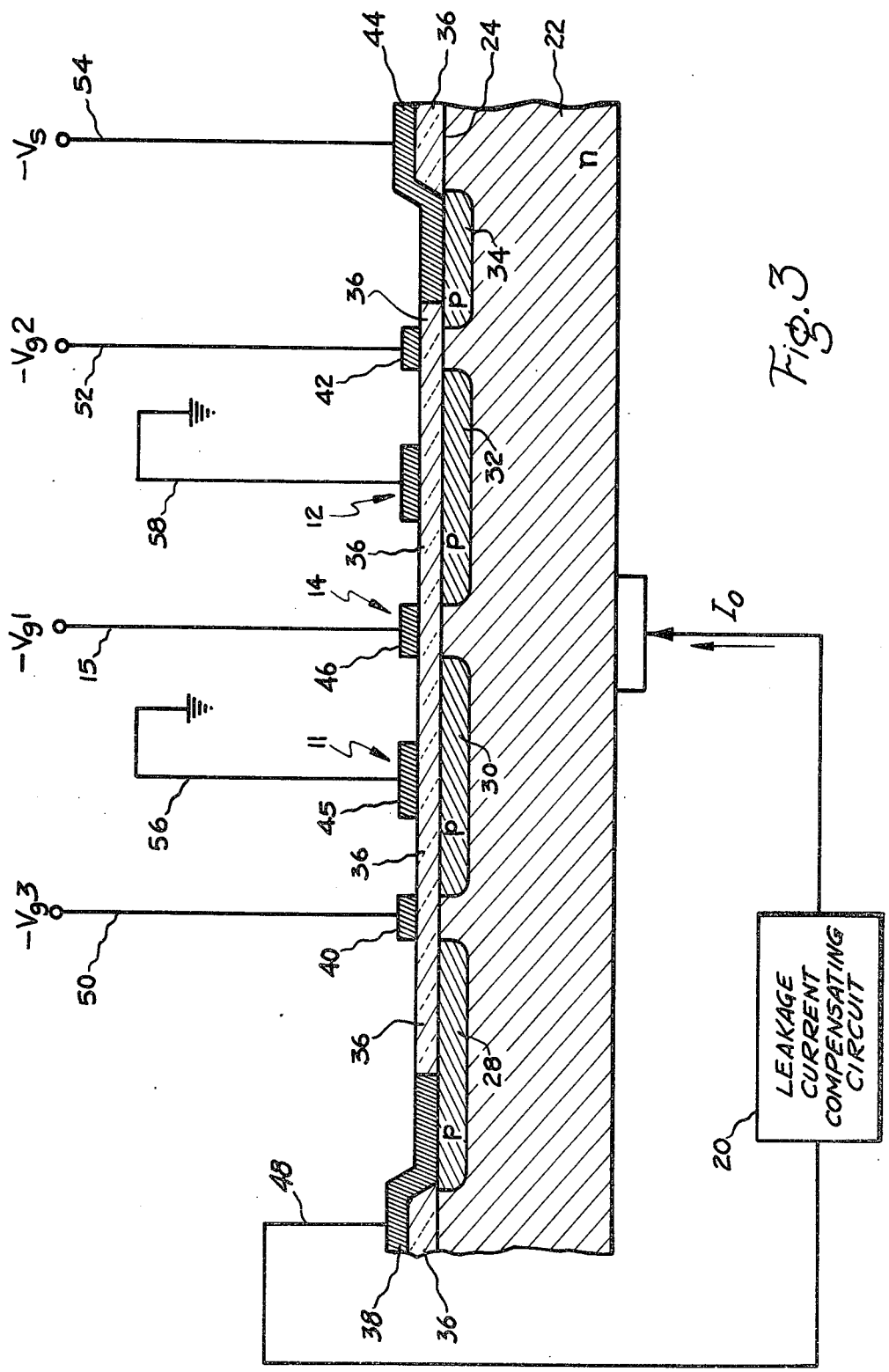

CHARGE TRANSFER CIRCUIT WITH LEAKAGE CURRENT COMPENSATING MEANS

BACKGROUND OF THE INVENTION

The present invention is related to charge transfer circuits of the type comprising first and second charge storage locations and a charge transfer transistor for transferring a plurality of discrete packets of charge from the first to the second charge storage location. Charge transfer circuits of the foregoing type are particularly useful in monolithic analog to digital converters such as those described in U.S. Patent application Ser. No. 628,542, filed Nov. 3, 1975 now superseded by allowed continuation application Ser. No. 853,115, filed Nov. 21, 1977, and assigned to the assignee of the present application. Exemplary of several other applications of such circuits is U.S. Pat. No. 3,819,954 which discloses a charge transfer delay line circuit.

While the uses of charge transfer circuits are varied, a common requirement of charge transfer analog to digital converters is that an equal amount of charge be transferred to the second charge storage location during each charge transfer operation. This requirement is especially crucial when the analog to digital converter is required to provide absolute measurement.

In applications of this type, a signal proportional to the analog signal being converted is applied to the first charge storage location. During each of a plurality of charge transfer operations, a metered charge packet, proportional to the magnitude of the signal applied to the first charge storage location, is transferred to the second charge storage location. Since the magnitude of each metered charge packet is ideally constant and proportional to the signal applied to the first charge storage location, the number of metered charge packets required to charge the second charge storage location from a first to a second value is ideally proportional to the magnitude of the analog signal being converted.

The foregoing relationship is modified in actual application by thermally-induced and/or optically-induced leakage currents in the semi-conductor substrate in which the first and second charge storage locations and the charge transfer transistor are preferably formed. A quantity $Q_L$ of leakage current is then collected at the second charge storage location during each charge transfer interval. Since the magnitude of this thermal- or photon-induced leakage current varies with temperature or illumination, the number of charge packets required to change the charge stored at the second charge storage location from a first to a second value varies with varying substrate temperatures or illumination levels. Such variations result in inaccurate measurements. The present invention is designed to account for these changes so as to provide a temperature- or ambient- illumination-insensitive output.

BRIEF SUMMARY OF THE INVENTION

In a first embodiment of the invention, changes in the magnitude of the thermally or optically induced leakage current (hereinafter referred to as leakage current) are compensated for by adjusting the magnitude of the charge in the first charge storage location prior to each charge transfer operation by an amount sufficient to offset variations in the magnitude of the leakage current. In this embodiment, the first charge storage location is recharged after each charge transfer operation and the magnitude to which the first charge storage location is recharged is varied as an inverse function of the increasing or decreasing leakage current.

In a second embodiment of the invention, the magnitude of the charge stored at the first charge storage location prior to a charge transfer operation, is held constant and the magnitude of charge transferred to the second charge storage location is permitted to vary as a function of the leakage current. Such variations are taken into account by integrating the leakage current over the measuring period during which charges are being transferred to the second charge storage location and adding the integrated signal to an analog voltage to which the charge at the second storage location is compared. By properly adjusting the value of an integrating constant associated with the integrating process, it is possible to compensate for errors introduced into the charge measurement process by changes in the magnitude of leakage current.

BRIEF DESCRIPTION OF THE DRAWINGS

For the purpose of illustrating the invention, there is shown in the drawings several embodiments which are presently preferred; it being understood, however, that this invention is not limited to the precise arrangements and instrumentalities shown.

FIG. 1 is a block diagram of the first embodiment of the present invention;

FIG. 3 is a sectional view of one MOS implementation of the circuit of FIG. 1;

DETAILED DESCRIPTION OF THE INVENTION

Figure 4:
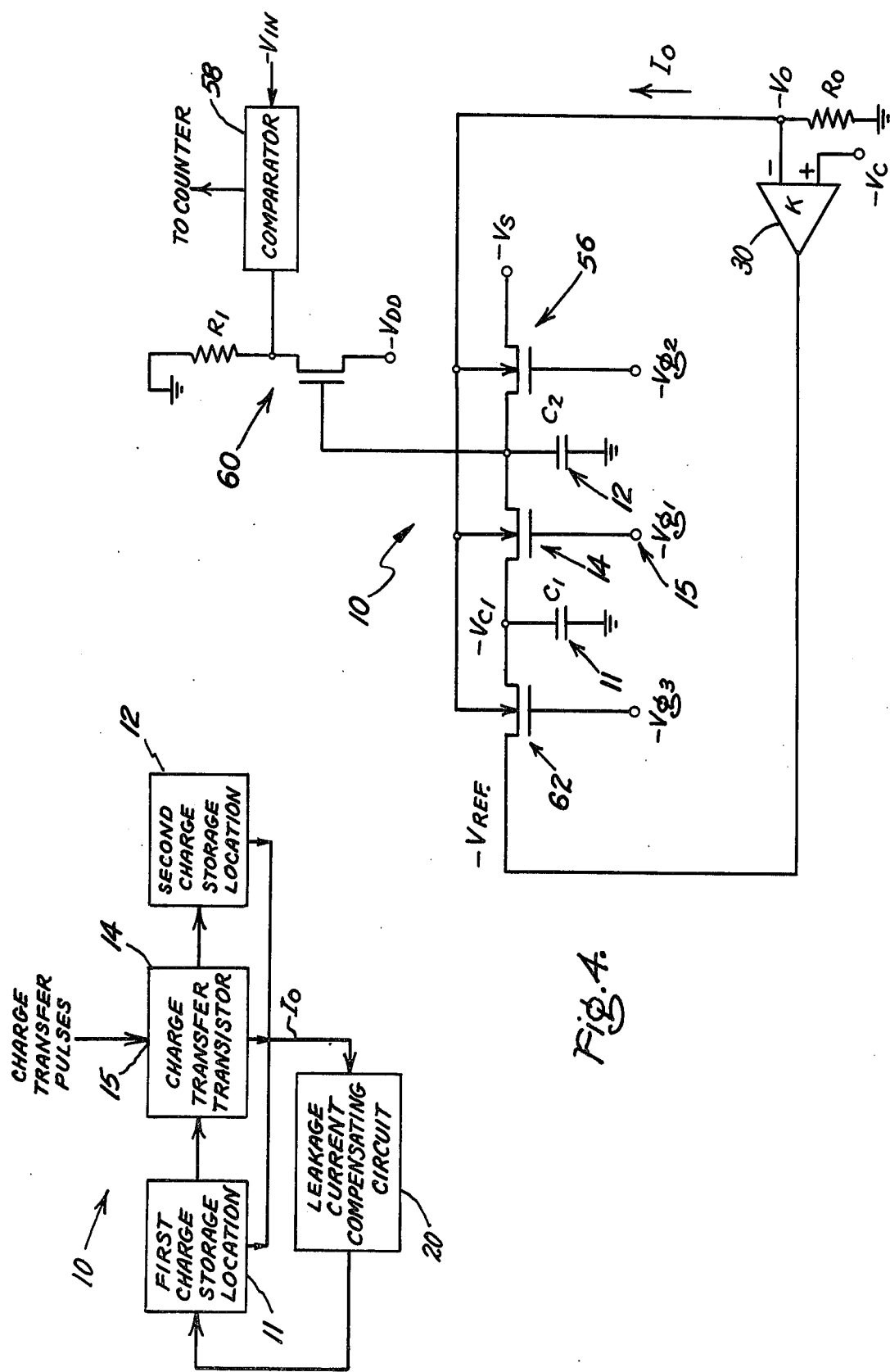
FIG. 4 is a circuit diagram of the first embodiment of the present invention as used in connection with a bucket brigade analog to digital converter.

Referring now to the drawings, wherein like numerals indicate like elements, there is shown in FIG. 1 a charge transfer circuit constructed in accordance with the principles of the present invention and designated generally as 10. Charge transfer circuit 10 is preferably a monolithic device which comprises a first charge storage location 11, a second charge storage location 12 and a charge transfer transistor 14 all formed in a single semi-conductor substrate. Charge transfer transistor 14 receives a plurality of clock pulses at its gate terminal 15, each of which cause the transistor 14 to transfer a metered packet of charge $Q_M$ from the first charge storage location 11 to the second charge storage location 12. Thus, the magnitude $Q_T$ of each incremental change in charge at the second storage location comprises two components—the charge $Q_M$ of the transferred charge packet plus the charge $Q_L$ of the leakage current introduced into the second charge storage location from the substrate during each charge transfer interval or cycle.

Figure 2A:
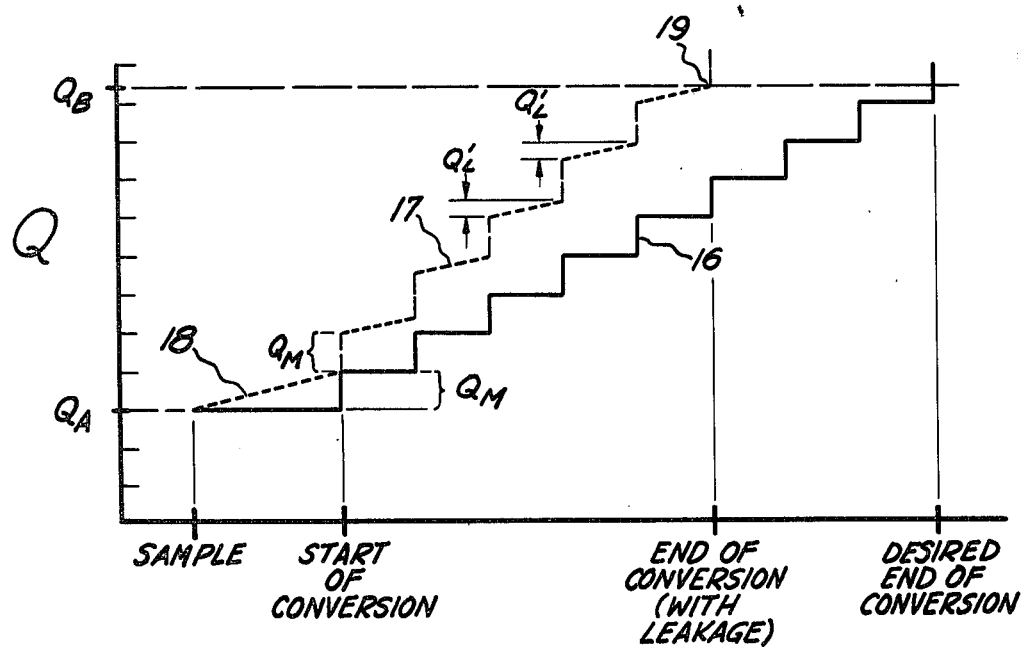
FIGS. 2a and 2b are a pair of graphs illustrating the conversion process when the size of the transferred charge packets is respectively independent and dependent of the leakage current.

Referring to FIG. 2a, the charge Q stored at second storage location 12 is initialized at level $Q_A$ by sampling an input. Thereafter, the conversion process commences and charge packets of magnitude $Q_M$ are transferred to the second storage location until a threshold level $Q_B$ is reached, when the conversion process is terminated. Each "step" of transferred charge is a single count which is accumulated to determine the total conversion count. A first conversion curve 16 illustrates the desired (idealized) case, wherein no leakage current is present. The level $Q_A$ of charge is maintained constant from Sample to Start of Conversion and the change in charge stored in the second charge storage location is increased only in metered steps of magnitude $Q_M$ until level $Q_B$ is reached, with a Desired End of Conversion count, e.g. 9 counts or 9 $Q_M$. A second conversion curve 17 illustrates the increase 18 in charge at the second charge storage location by some amount $Q_L$ proportional to the leakage current, in the arbitrary time interval between Sample and Start of Conversion. Thus, after the first transfer of a charge packet $Q_M$, the charge level is $Q_A+Q_M+Q_L$, rather than the expected (non-leakage case) level of $Q_A+Q_M$. Leakage current continually adds leakage charges $Q_L$ to cause a greater amount of charge to be stored, at the second charge storage location, than should be stored for accurate conversion. The actual End of Conversion 19 is thus reached for a number of charge packet transfers less than that number corresponding to an accurate conversion of an analog input signal; the amount of conversion error is proportional to the leakage current causing variations in the charge stored at storage location 12.

Figure 2B:
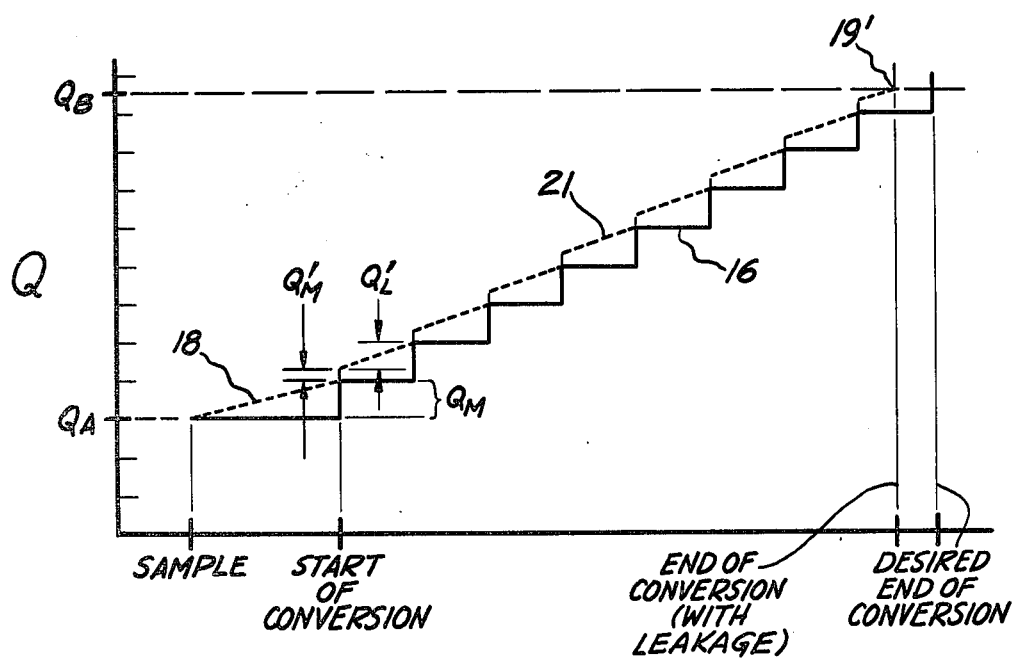

To compensate for this variation, the present invention includes a leakage current compensation circuit 20 which recharges the first charge storage location 11 after each charge transfer operation to a level that varies as an inverse function of the substrate leakage current $I_o$. Particularly, the level to which storage location 11 is charged after each charge transfer operation varies from a predetermined value by an amount sufficient to offset variations in the magnitude of the substrate leakage current $I_o$ such that charge transfer transistor 14 transfers a variable amount of charge from first charge storage location 11 to second charge storage location 12 during each charge transfer operation, whereby the total charge change for each transfer to the second charge storage location is constant regardless of changes in the temperature of the transistor over a predetermined temperature range. Thus, as shown in FIG. 2b, a compensated curve 21 results wherein the compensated charge packet transfers charge $Q_M'$ of lesser magnitude to allow for leakage $Q_L$ in the time interval between charge transfers, and cause the actual End of Conversion to occur generally within one count of the actual count obtainable without the presence of leakage current.

FIG. 3 illustrates in a sectional view an exemplary monolithic embodiment of the circuit of FIG. 1. A semiconductor substrate 22 of a first conductivity type, as for example n-type, is provided having four impurity regions 28, 30, 32 and 34 each extending from a first surface 24 thereof down towards, but not meeting, a second surface 26. Regions 28-34 may be formed by any convenient method, as for example by diffusion, by epitaxial growth, by ion implantation or by any other process as is well known to those skilled in the art. Regions 28-34 are of opposite conductivity type to that of the semi-conductor substrate 22 and in this exemplary embodiment are illustrated as p-type regions. An insulating oxide layer 36 overlies surface 24. Dig-down holes are provided to allow metallizations 38 and 44 to ohmically contact p-type regions 28 and 34, respectively. Metallizations 45, 46 and 47 insulatively overlie surface 24. Metallizations 38, 42, 44 and 46 are provided with electrical contact terminals 48, 52, 54 and 15, respectively, and metallizations 45 and 47 may be connected to electrical ground for the application of the appropriate electrical potentials thereto.

The charge transfer circuit 10 of FIG. 3 may be considered generally as a MOS bucket-brigade implementation of the charge transfer portion of an analog to digital converter in accordance with the present invention. Thus, charge transfer circuit 10 of FIG. 3 comprises a first charge storage location 11 which is defined by the electrode 45 and the p-type impurity region 30 (the insulating oxide 36 acting as a dielectric); the charge transfer transistor 14 is defined by the p-type regions 30 and 32 (which define the drain and source of the transistor) and the metallization 46 (which defines the gate of the transistor); the second charge storage location 12 is defined by metallization 47 and the p-type region 32 (the insulating oxide 36 acting as a dielectric). The first charge storage location 11 is preferably grounded at electrical contact terminal 56 as is the second storage location 12 at the electrical contact terminal 58. The drain and source of transistor 14 are connected to first and second capacitors 11 and 12 at p-regions 30 and 32, respectively. The clock pulses used for charge transfer are applied to the gate of transistor 14 at electrical contact terminal 15. The output of the bucket brigade circuit (that is, the storage charge at second charge storage location 12) is monitored by source follower 60 which is connected to p-region 32.

The thermally induced leakage current $I_o$ is measured at second surface 26 of substrate 22 and, in the embodiment illustrated in FIG. 3, flows in the direction from the second surface 26 to the first surface 24. The leakage current $I_o$ is measured by the leakage current compensating circuit 20 which applies voltage to p-region 28, which voltage varies as a function to the magnitude of leakage current.

The operation of applicants' charge transfer circuit 10 can be better understood with reference to FIG. 4. FIG. 4 illustrates an application of the present charge transfer circuit as a bucket brigade analog to digital converter. Analog to digital converters of this type are described in detail in U.S. Patent application Ser. No. 628,542 filed Nov. 3, 1975 now superseded by allowed continuation application Ser. No. 853,115 filed Nov. 21, 1977, and assigned to the assignee of the present application. The operation of such circuits is well known and need not be described in detail herein. A brief description of the operation of that portion of the analog to digital circuit illustrated in FIG. 4 will, however, be provided.

The basic principle behind bucket brigade analog to digital converters is that the number of charge packets required to increase the voltage across a storage device, such as a capacitor, from a first reference value to a second value representative of the analog signal being converted is proportional to the magnitude of the analog signal. Accordingly, by counting the number of charge packets transferred to the charge storage element it is possible to obtain a digital representation of the analog voltage being converted.

Applying the foregoing principle to the circuit of FIG. 4, the second charge storage location (capacitor ($C_2$)) is precharged to a first predetermined value $-V_s$ by a switching transistor 56 which is gated by a negative pulse $-V_{g2}$. After capacitor $C_2$ has been precharged to $-V_s$ volts, a plurality of discrete charge packets are transferred from the first charge storage location 11

(capacitor $C_1$) to the second charge location 12 (capacitor $C_2$).

Each charge transfer operation is initiated by a charge transfer pulse $-V_{g1}$ applied to the gate 15 of charge transfer transistor 14. Charge transfer transistor 14 is operated as a "shelf" transistor. That is, transistor 14 turns on when a negative pulse $-V_{g1}$ is applied to its gate and turns off when its source voltage falls to a value equal to its gate voltage $V_{g1}$ minus its threshold voltage $V_t$. As the result of the foregoing operation of charge transfer transistor 14, the voltage across capacitor $C_2$ increases (i.e., becomes less negative) during each charge transfer operation, by an amount:

$$\Delta V = (V_{g1} - V_t - V_{C1})/N + Q_o/NC_1 \quad (1)$$

wherein $V_t$ is the threshold voltage of transistor 14, N is the ratio $C_2/C_1$ and $Q_o$ is the substrate leakage charge (and assuming $C_2 = NC_1$). In the above equation, the quantity $(V_{g1} - V_t - V_{C1})/N$ is a voltage due to the charge packet, and the quantity $Q_o/NC_1$ is the voltage increment due to substrate leakage current.

After K charge transfer operations, the voltage across capacitor $C_2$ has increased from $-V_s$ volts to a value corresponding to the analog signal $-V_{in}$ being converted. At this point, comparator 58, which receives the voltage across capacitor $C_2$ at a first input via source follower 60 and the analog voltage $-V_{in}$ at a second input, generates an output signal which inhibits the counter counting the number of gating pulses applied to charge transfer transistor 14. The count in the counter will then represent the magnitude of the analog voltage $-V_{in}$ being converted.

It should be apparent from the foregoing, that any changes in the magnitude of the charge collected at $C_2$ during each charge transfer operation will result in inaccuracies in the conversion process. Variations in the temperature of the substrate, for example, will result in variations in the magnitude of the second term of equation (1) above and produce an inaccurate conversion.

In order to compensate for changes in the magnitude of the second term of equation (1), the circuit of FIG. 3 includes a leakage current compensating circuit which varies the magnitude of the first term of equation (1) as an inverse function of changes in the magnitude of the second term of equation (1) so as to assure that the change in voltage $\Delta V$ across capacitor $C_2$ remains substantially constant after each charge transfer operation. Particularly, the leakage current compensating circuit of FIG. 3 adjusts the magnitude of the voltage $V_{C1}$ by an amount sufficient to offset changes in the magnitude of the second term of equation (1) due to changes in the value of the leakage charge $Q_o$.

The leakage current compensating circuit of FIG. 4 comprises a leakage current resister $R_o$, a difference amplifier 30 and a switching transistor 62. The leakage current resistor $R_o$ is connected between the inverting input of difference amplifier 30 and ground. The substrate leakage current $I_o$ is applied to resistor $R_o$ to generate a leakage current compensating voltage $-V_o$ which is applied to the inverting terminal of difference amplifier 30. Difference amplifier 30 also receives a constant voltage $-V_c$ at its non-inverting terminal and applies the difference signal $$V_{ref} = k(-V_c + V_o) \quad (2)$$

(where k is the amplification constant of difference amplifier 30) to the source of transistor 62. The magnitude of signal $-V_{ref}$ therefore varies as an inverse function of the magnitude of the leakage current $I_o$.

Switching transistor 62 is gated, by a gating pulse $-V_{g3}$, after each charge transfer operation and causes capacitor $C_1$ to recharge to a new value $-V_{ref}$ after each charge transfer operation. Since the magnitude of the signal $-V_{ref}$ varies as an inverse function of the leakage current $I_o$, it is possible to recharge capacitor $C_1$ to a value which will offset changes in the magnitude of the second term of equation (1) by properly choosing the value of the amplification constant k of equation (2).

A simple example will suffice for those skilled in the art to demonstrate the manner in which the value of the amplification constant k should be chosen for any particular application. The value of the difference voltage $-V_{ref}$ may be written as follows:

$$V_{ref} = k(V_c - I_o R_o) \quad (3)$$

Accordingly, the voltage across capacitor $C_2$ increases by an amount:

$$\Delta V = (V_{g1} - V_t - kI_o R_o)/N + Q_o/NC_1 \quad (4)$$

following each charge transfer operation.

If it is assumed that the temperature will increase by 10° C. during the normal usage of the analog to digital converter, then the values of the leakage current and leakage charge, $I_o$ and $Q_o$, respectively, will approximately double. In such a case, the increase in the voltage across capacitor $C_2$ during each charge transfer operation will change from the value noted in equation (4) to a value:

$$\Delta V = (V_{g1} - V_t + kV_{C1} - 2kI_o R_o)/N + 2Q_o/NC_1 \quad (5)$$

Examining equations (4) and (5) it can be seen that by setting the magnitude of the amplification constant k equal to $$k = Q_o/I_o R_o C_1 \quad (6)$$

it is possible to keep $\Delta V$ constant over a range of temperature provided the assumption pertaining to the leakage current temperature dependence is correct. A similar calculation may be used for other models.

Figure 5:
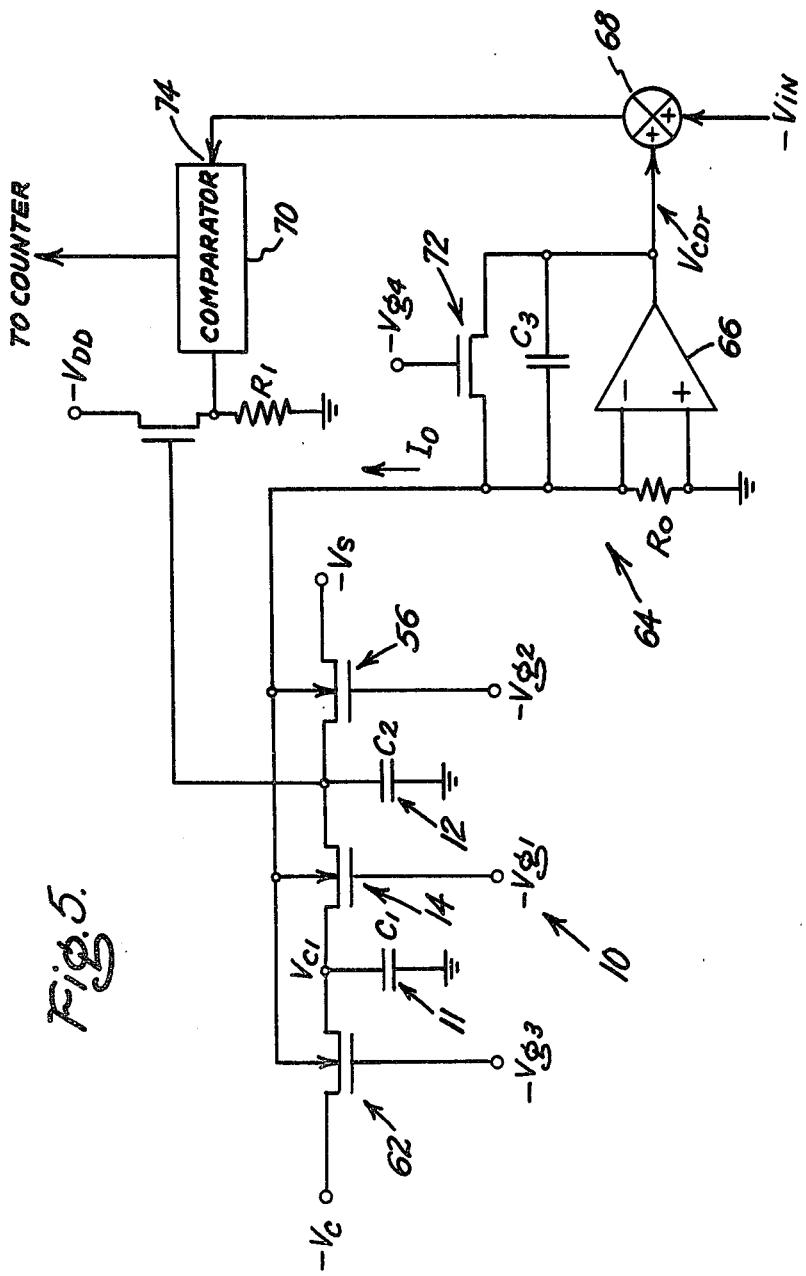
FIG. 5 is a circuit diagram of a second embodiment of the present invention as used in connection with a bucket brigade analog to digital converter.

A second embodiment of the present invention is illustrated in FIG. 5. The operation of the bucket brigade circuit including capacitors $C_1$ and $C_2$, switching transistors 56 and 62 and charge transfer transistor 14 are substantially as described above. The voltage applied to the source of transistor 62 is, however, kept at a constant level $-V_C$. For this reason, the charge accumulated by capacitor $C_2$ during each charge transfer operation varies as a function of the leakage current $I_o$. To compensate for this variation, the charge transfer circuit to FIG. 5 includes a leakage current compensating circuit 64 which integrates the leakage current $I_o$ over the measuring period during which charge packets are being transferred from capacitor $C_1$ to capacitor $C_2$ and adds this signal to the analog voltage $-V_{in}$ being converted. Leakage current compensating circuit 64 includes a comparator 66, an integrating capacitor $C_3$, a leakage resistor $R_o$ and an adder circuit 68. By properly selecting the value of capacitor $C_3$, it is possible to make the analog to digital converter temperature independent.

The increase in the voltage across capacitor $C_2$ after each charge transfer operation is given in equation (1), above. If it is assumed that it takes K packets of charge to be supplied to the capacitor $C_2$ for the voltage across the capacitor $C_2$ to reach the threshold voltage of comparator 58, the amount of voltage across the capacitor $C_2$ reduced by the thermal leakage current $I_o$ is $KQ_o/NC_1$. Since the magnitude of the leakage current $I_o$ is constant at a given temperature, the output of linear integrator 64 will be:

$$V_{cor} = I_o t / C_3 \quad (7)$$

where it is assumed that integrator 32 is reset at the beginning of each conversion period by applying a negative-going pulse $V_{g4}$ to the gate of switching transistor 72. Setting the elasped time $t = KT$ where $T = 1/f$ and $f$ = the frequency of the negative going pulses $-V_{g1}$, equation (7) becomes:

$$V_{cor} = I_o TK / C_3 \quad (8)$$

Since the purpose of leakage current compensation circuit 64 is to offset errors in the amount of voltage applied to capacitor $C_2$ during each charge transfer operation, its output $V_{cor}$ should be equal to the error in the voltage across capacitor $C_2$ resulting from the leakage current $I_o$ over the measuring period during which charge is being transferred from capacitor $C_1$ to capacitor $C_2$. That is, the output $V_{cor}$ should be equal to the error voltage across capacitor $C_2$ resulting from the second term of equation (1). The foregoing result will be obtained if equation (8) is set equal to the total voltage applied to capacitor $C_2$ during K charge transfer operations by the second term of equation (1), or:

$$KQ_o/NC_1 = I_o TK / C_3 \quad (9)$$

Thus, if capacitor $C_3$ is chosen to equal $(NC_1 I_o T)/Q_o$, the threshold level at input 74 of comparator 70 will be properly corrected for errors induced into the charge measurement process by the substrate leakage current $I_o$.

In the foregoing description of the invention, transistors 14, 56 and 62 were assumed to be p-channel MOSFET transistors. It should be clear to those skilled in the art that the disclosed circuit could also be implemented using n-channel MOSFET or other transistors. Since the use of an n-channel MOSFET would result in a reversal of the polarity of all of the signals described above, the term "charge" as used herein should be recognized as including both negative and positive charges as appropriate to the particular implementation of the claimed circuits.

The present invention may be embodied in other specific forms without departing from the spirit or essential attributes thereof and, accordingly, reference should be made to the appended claims, rather than to the foregoing specification, as indicating the scope of the invention.

What is claimed is:

1. A charge transfer circuit of the type subject to temperature and illumination effects causing variations in leakage current therein, comprising:
    a first charge storage location;
    a second charge storage location;
    a charge transfer means for transferring a plurality of discrete packets of charge from said first charge storage location to said second charge storage location, the magnitude of each of said charge packets being a function of both the magnitude of charge at said first charge storage location just prior to the initiation of a charge transfer operation and the magnitude of a leakage current associated with at least both said first and second charge storage locations of said charge transfer means; and
    means for recharging said first charge storage location after each said charge transfer operation, the level to which said recharging means recharges said first charge storage location after each said charge transfer operation being continuously variable from a predetermined value by an amount inversely related to, and sufficient to offset, variations in the magnitude of said leakage current such than an equal amount of charge is received at said second charge storage location during each charge transfer operation regardless of changes in the temperature and illumination of said charge transfer means over predetermined ranges of temperature and illumination.

2. The charge transfer circuit of claim 1 wherein said recharging means comprises:
    means for generating a reference signal whose magnitude varies as a function of said changes in said leakage current; and
    switch means operative after each said charge transfer operation for causing said first charge storage location to charge to a level whose magnitude is determined by said reference signal.

3. The charge transfer circuit of claim 2 wherein said means for generating a refererence voltage comprises:
    means for generating a leakage current magnitude signal indicative of the magnitude of said leakage current; and
    means for adding said leakage current magnitude signal to a signal of fixed magnitude to generate said reference signal.

4. The charge transfer circuit of claim 2 wherein said switch means comprises a switching transistor.

5. The charge transfer circuit of claim 4 wherein said means for generating a reference signal comprises:
    means for generating a leakage current signal representative of the magnitude of the combined leakage current of said charge transfer means and said switching transistor and
    means for adding said leakage current signal to a signal of fixed magnitude to generate said reference signal.

6. The charge transfer circuit of claim 1 wherein said charge transfer means is a MOSFET.

7. The charge transfer circuit of claim 6 wherein first and second charge storage location and said MOSFET are formed in a semi-conductor substrate and wherein said leakage current is the leakage current in said substrate.

8. A charge transfer circuit for use in a digital to analog converter, said circuit comprising:
    a semi-conductor substrate;

a first charge storage location formed in said substrate;

a second charge storage location formed in said substrate;

a charge transfer means formed in said substrate for transferring a plurality of discrete packets of charge from said first to said second charge location, each said charge packet having a first component resulting from the charge originating at said first charge storage location and a second charge component resulting from a thermally induced leakage current in said substrate, the magnitude of said second component varying as a function of the temperature of said substrate;

means for generating a correction signal indicative of both the charge added to said second charge storage location as a result of said second component and the charge directly added to said second charge storage location through said substrate as a function of said leakage current; and means responsive to said correction signal for modifying an analog signal to be converted by an amount corresponding to the amount of charge added to said second charge storage location as a result of said second component.

9. The charge transfer circuit of claim 8 wherein said means for generating a correction signal includes means for integrating a signal representative of the magnitude of said leakage current.

10. The charge transfer circuit of claim 9 wherein said means for integrating said signal representative of the magnitude of said leakage current comprises an operational amplifier having an inverting and non-inverting input terminals and an output terminal and an integrating capacitor connected between said non-inverting input and said output and wherein said signal representative of said leakage current is applied to said non-inverting input terminal.

11. The charge transfer circuit of claim 10 wherein said integrating capacitor is discharged after each charge transfer operation.

12. The charge transfer circuit of claim 8 wherein said means for modifying said analog signals to be converted comprises an adding circuit.

* * * * *